United States Patent
Chilese et al.

(10) Patent No.: US 9,810,991 B2
(45) Date of Patent: Nov. 7, 2017

(54) SYSTEM AND METHOD FOR CLEANING EUV OPTICAL ELEMENTS

(71) Applicant: KLA-Tencor Corporation, Milpitas, CA (US)

(72) Inventors: Frank Chilese, San Ramon, CA (US); Gildardo Delgado, Livermore, CA (US); Rudy F. Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/578,301

(22) Filed: Dec. 19, 2014

(65) Prior Publication Data

US 2015/0253675 A1 Sep. 10, 2015

Related U.S. Application Data

(60) Provisional application No. 61/919,816, filed on Dec. 23, 2013.

(51) Int. Cl.
  *G03B 27/52* (2006.01)
  *G03F 7/20* (2006.01)

(52) U.S. Cl.
  CPC ...... *G03F 7/70033* (2013.01); *G03F 7/70925* (2013.01); *G03F 7/70933* (2013.01)

(58) Field of Classification Search
  CPC .................. G03F 7/70033; G03F 7/70925
  (Continued)

(56) References Cited

U.S. PATENT DOCUMENTS

| 7,518,128 B2 | 4/2009 | Van Herpen et al. |
| 8,382,301 B2 * | 2/2013 | Ehm ............... B82Y 10/00 359/850 |

(Continued)

FOREIGN PATENT DOCUMENTS

| CN | 101356476 A | 1/2009 |
| WO | 0254115 A2 | 2/2002 |
| WO | 2004104707 A2 | 12/2004 |

OTHER PUBLICATIONS

PCT International Search Report for PCT/US2014/072218, dated Mar. 27, 2015, 3 pages.
Radiation Stability of EUV Multilayer Mirrors http://www.db-thueringen.de/servlets/DerivateServlet/Derivate-12195/Dissertation.pdf Jan. 21, 1979, 95 pages.
(Continued)

*Primary Examiner* — Hung Henry Nguyen
(74) *Attorney, Agent, or Firm* — Suiter Swantz pc llo

(57) ABSTRACT

A system for cleaning or suppressing contamination or oxidation in a EUV optical setting includes an illumination source, a detector, a first set of optical elements to direct light from the illumination source to a specimen and a second set of optical elements to receive illumination from the specimen and direct the illumination to the detector. The system also includes one or more vacuum chambers for containing the first and second set of optical elements and containing a selected purge gas ionizable by the light emitted by the illumination source. The first or second set of optical elements includes an electrically biased optical element having at least one electrically biased surface. The electrically biased optical element has a bias configuration suitable to attract one or more ionic species of the selected purge gas to the electrically biased surface in order to clean contaminants from the electrically biased surface.

21 Claims, 10 Drawing Sheets

(58) Field of Classification Search
USPC .......... 355/30, 53, 67; 250/504 R, 492.2
See application file for complete search history.

(56) References Cited

U.S. PATENT DOCUMENTS

| | | |
|---|---|---|
| 8,633,459 B2 | 1/2014 | Bykanov et al. |
| 8,711,346 B2 | 4/2014 | Stokowski |
| 8,785,082 B2 | 7/2014 | Xiong et al. |
| 8,916,831 B2 | 12/2014 | Wang et al. |
| 2002/0168049 A1 | 11/2002 | Schriever et al. |
| 2007/0283591 A1 | 12/2007 | Singer et al. |
| 2009/0014027 A1 | 1/2009 | Schriever |
| 2010/0288302 A1 | 11/2010 | Ehm et al. |
| 2011/0058147 A1 | 3/2011 | Ehm et al. |
| 2011/0222040 A1 | 9/2011 | Steinhoff et al. |
| 2012/0235049 A1 | 9/2012 | Wang |
| 2012/0238096 A1 | 9/2012 | Xiong et al. |
| 2013/0114059 A1 | 5/2013 | Jak et al. |
| 2013/0256567 A1* | 10/2013 | Kakizaki ............ G03F 7/70033 250/504 R |
| 2013/0322076 A1 | 12/2013 | Parker et al. |

OTHER PUBLICATIONS

Radiation Generated Plasmas a challenge in modern lithography http://alexandria.tue.nl/extra2/200810574.pdf, May 14, 2008, 187 pages.

Stephen V. ONeil and William P. Reinhardt Photoionization of Molecular Hydrogen http://scitation.aip.org/content/aip/journal/jcp/69/5/10.1063/1.436813 J. Chem. Phys. 69, 2126 (1978).

George Gioumousis1 and D. P. Stevenson1 Reactions of Gaseous Molecule Ions with Gaseous Molecules http://scitation.aip.org/content/aip/journal/jcp/29/2/10.1063/1.1744477 J. Chem. Phys. 29, 294 (1958).

D. Ehm, M. van Kampen, D. Glushkov, J. de Kuster, J. Huijbregtse, D. Lopaev, and V. Ivanov EUV-induced cleaning in a background gas http://www.sematech.org/meetings/archives/litho/8653/poster/P040_vanKampen_CarlZeiss.pdf 10th ASML Technology Conference Jun. 24, 2009, 1 page.

N. Škoro, E. Gogolides Cleaning of Organic Contamination from EUV Optics Surfaces Using Hydrogen-based Plasmas http://www.pse-conferences.net/tl_files/pse2012/abstractupload/PSE2012-PO1029-ext.pdf, 13th International Conference on Plasma Surface Engineering, Sep. 2012, Garmisch-Partenkirchen, Germany, 4 pages.

* cited by examiner

SYSTEM AND METHOD FOR CLEANING EUV OPTICAL ELEMENTS

PRIORITY

The present application claims priority under 35 U.S.C. §119(e) to U.S. Provisional Patent Application Ser. No. 61/919,816, entitled EUV INDUCED CLEANING OF CARBON AND OXIDATION DUE TO REACTIVE SPECIES CREATED WITH RADIATION, filed Dec. 23, 2013, naming Gil Delgado, Frank Chilese, Rudy Garcia and David Alles as inventors, which is currently co-pending, or is an application of which currently co-pending application(s) are entitled to the benefit of the filing date. The above application is incorporated herein by reference in the entirety.

TECHNICAL FIELD

The present disclosure generally relates to the field of extreme ultraviolet optical systems and, more particularly, to cleaning optical elements of extreme ultraviolet optical systems.

BACKGROUND

As the demand for lithography-based device structures having ever-smaller features continues to increase, the need for improved illumination sources used for lithography and inspection of the associated reticles that lithographically print these ever-shrinking devices continues to grow. One such illumination source, utilized in lithography and inspection systems, is an extreme ultraviolet (EUV) light source.

EUV inspection systems, and especially their optics, need to operate in a clean vacuum environment. However, contaminants that tend to foul the vacuum environment cannot be completely removed from the system. Such is the case, for example, when components of the EUV system, such as adhesives, actuators, and cables, contain unavoidable contamination sources. As a result, the EUV optics, within the vacuum chamber, are exposed to a partial pressure of contaminants, such as hydrocarbons and gas phase $H_2O$. These contaminants, when exposed to the EUV radiation within the tool, will lead to the growth of carbon and/or oxides optical surfaces of the system, such as mirrors. In the case of mirrors, the contamination will cause a reflectivity drop, resulting in a phase change in the light incident upon a given mirror. Both of these effects, if unchecked, will cause a degradation of the optics over time, leading to a failure of the optical system.

Therefore, it is desirable to provide a method and system that cure the defects of the prior art identified above.

SUMMARY

An optical system is disclosed, in accordance with an illustrative embodiment of the present invention. In one illustrative embodiment, the system includes an illumination source configured to generate light. In one illustrative embodiment, the system includes a detector. In another illustrative embodiment, the system includes a first set of optical elements configured to direct at least a portion of the light to one or more specimens. In another illustrative embodiment, the system includes a second set of optical elements configured to receive illumination from the surface of the one or more specimens and direct the illumination from the one or more specimens to the detector. In another illustrative embodiment, the system includes one or more vacuum chambers, wherein at least one of the first set of optical elements or the second set of optical elements are disposed in the one or more vacuum chambers, wherein the one or more vacuum chambers are configured to contain a selected purge gas ionizable by the light emitted by the illumination source. In another illustrative embodiment, at least one of the first set of optical elements or the second set of optical elements includes an electrically biased optical element having at least one electrically biased surface, the electrically biased optical element having a bias configuration suitable to attract one or more ionic species of the selected purge gas to the at least one electrically biased surface in order to clean contaminants from the at least one electrically biased surface.

An optical system is disclosed in accordance with another illustrative embodiment of the present disclosure. In one illustrative embodiment, the system includes an illumination sub-system, the illumination sub-system including an illumination source configured to generate at least extreme ultraviolet light, the illumination sub-system further including a set of collection optics configured to collect illumination from an illumination source. In another illustrative embodiment, the system includes a set of illuminator optics configured to direct illumination from the collection optics of the illumination sub-system to one or more specimens. In another illustrative embodiment, the system includes a detector. In another illustrative embodiment, the system includes a set of projection optics configured to receive illumination from the surface of the one or more specimens and direct the illumination from the one or more specimens to the detector. In another illustrative embodiment, the system includes one or more vacuum chambers, wherein at least one of the illumination sub-system, the set of illuminator optics, the detector or the set of projection optics are disposed in the one or more vacuum chambers, wherein the one or more vacuum chambers are configured to contain a selected purge gas ionizable by the extreme ultraviolet light emitted by the illumination source. In another illustrative embodiment, at least one of the one or more mirrors of the set of collection optics of the illumination sub-system, the one or more mirrors of the set of illuminator optics and the one or more mirrors of the set of projection optics includes an electrically biased optical element having at least one electrically biased surface, the electrically biased optical element having a bias configuration suitable to attract one or more ionic species of the selected purge gas to the at least one electrically biased surface in order to clean contaminants from the at least one electrically biased surface.

An optical system is disclosed in accordance with another illustrative embodiment of the present disclosure. In one illustrative embodiment, the system includes an illumination source configured to generate light and an ionizing homogenizer tunnel configured to homogenize light from the illumination source. In another illustrative embodiment, the ionizing homogenizer tunnel is further configured to ionize at least a portion of a fill gas contained within the homogenizer tunnel. In another illustrative embodiment, the system includes a detector, a first set of optical elements configured to direct at least a portion of light outputted from the ionizing homogenizer tunnel to one or more specimens and a second set of optical elements configured to receive illumination from the surface of the one or more specimens and direct the illumination from the one or more specimens to the detector.

An optical system is disclosed in accordance with another illustrative embodiment of the present disclosure. In one illustrative embodiment, the system includes an illumination source configured to generate light and a homogenizer tunnel including a homogenizer tunnel assembly configured to homogenize light from the illumination source. In another illustrative embodiment, the system includes a fill gas supply unit, wherein the fill gas supply unit is configured to supply a fill gas flow through the homogenizer tunnel assembly such that a fill gas pressure is established within the homogenizer tunnel assembly. In another illustrative embodiment, the system includes a detector, a first set of optical elements configured to direct at least a portion of light outputted from the homogenizer tunnel to one or more specimens and a second set of optical elements configured to receive illumination from the surface of the one or more specimens and direct the illumination from the one or more specimens to the detector.

An optical system is disclosed in accordance with another illustrative embodiment of the present disclosure. In one illustrative embodiment, the system includes an illumination source configured to generate light and a homogenizer tunnel including a homogenizer tunnel assembly configured to homogenize light from the illumination source. In another illustrative embodiment, the system includes a fill gas supply unit, wherein the fill gas supply unit is configured to supply a fill gas flow through the homogenizer tunnel assembly such that a fill gas pressure wave is propagated along the internal volume of the homogenizer tunnel assembly. In another illustrative embodiment, the system includes a detector, a first set of optical elements configured to direct at least a portion of light outputted from the homogenizer tunnel to one or more specimens and a second set of optical elements configured to receive illumination from the surface of the one or more specimens and direct the illumination from the one or more specimens to the detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

FIGS. 1A through 3C generally illustrate embodiments of a system and method for cleaning optical elements in an extreme ultraviolet optical system, in accordance with one or more embodiments of the present disclosure.

It is recognized that EUV (and VUV) radiation, when in the presence of molecular hydrogen ($H_2$), generate atomic hydrogen and hydrogen ions, both of which are useful for cleaning EUV-induced carbon growth and oxidation. Cleaning optical elements, such as a mirror, aids in recovering the observed loss of reflectivity caused by the carbon and/or oxidation growth. It is further noted that EUV and/or VUV light may also generate useful cleaning reactant gases through exposure to other gases, such as, but not limited to, molecular deuterium ($D_2$), molecular oxygen ($O_2$) and the like.

Some embodiments of the present disclosure are directed to targeting cleaning of EUV optics through the application of electrical biasing of selected optical surfaces. In this regard, when a selected optical element, such as a mirror or homogenizer tunnel, is negatively biased it may attract positively charged ions, such as $H^+$, $H^{2+}$ and $H^{3+}$, which serve as quality cleaning agents for the various optical surface of an EUV system. Such reactive cleaning agents are attracted to a biased surface and then react with the carbon and/or oxidation growth, resulting in gaseous reaction products, such as, but not limited to, methane ($CH_4$) and water ($H_2O$). These reaction products may then be removed from the optical system via a vacuum pump. Additional embodiments of the present disclosure may provide heating of one or more optical elements in order to enhance the cleaning process.

Additional embodiments of the present disclosure are directed to a homogenizer tunnel suitable for containing and ionizing. As noted above, the generated positive ions are preferentially attracted to one or more biased internal surfaces of the homogenizer tunnel, thereby cleaning the surfaces. The present disclosure provides a number of mechanisms utilized to ionize the fill gas within the given homogenizer tunnel.

Additional embodiments of the present disclosure serve to maintain a high fill gas pressure or establish a pressure wave within a homogenizer tunnel in order to clean the internal surfaces of the tunnel.

Additional embodiments of the present disclosure provide for a mask inspection system, a wafer inspection system or a lithography system (or other optical system), which incorporate the optics cleaning devices and methods described herein.

Figure 1A:
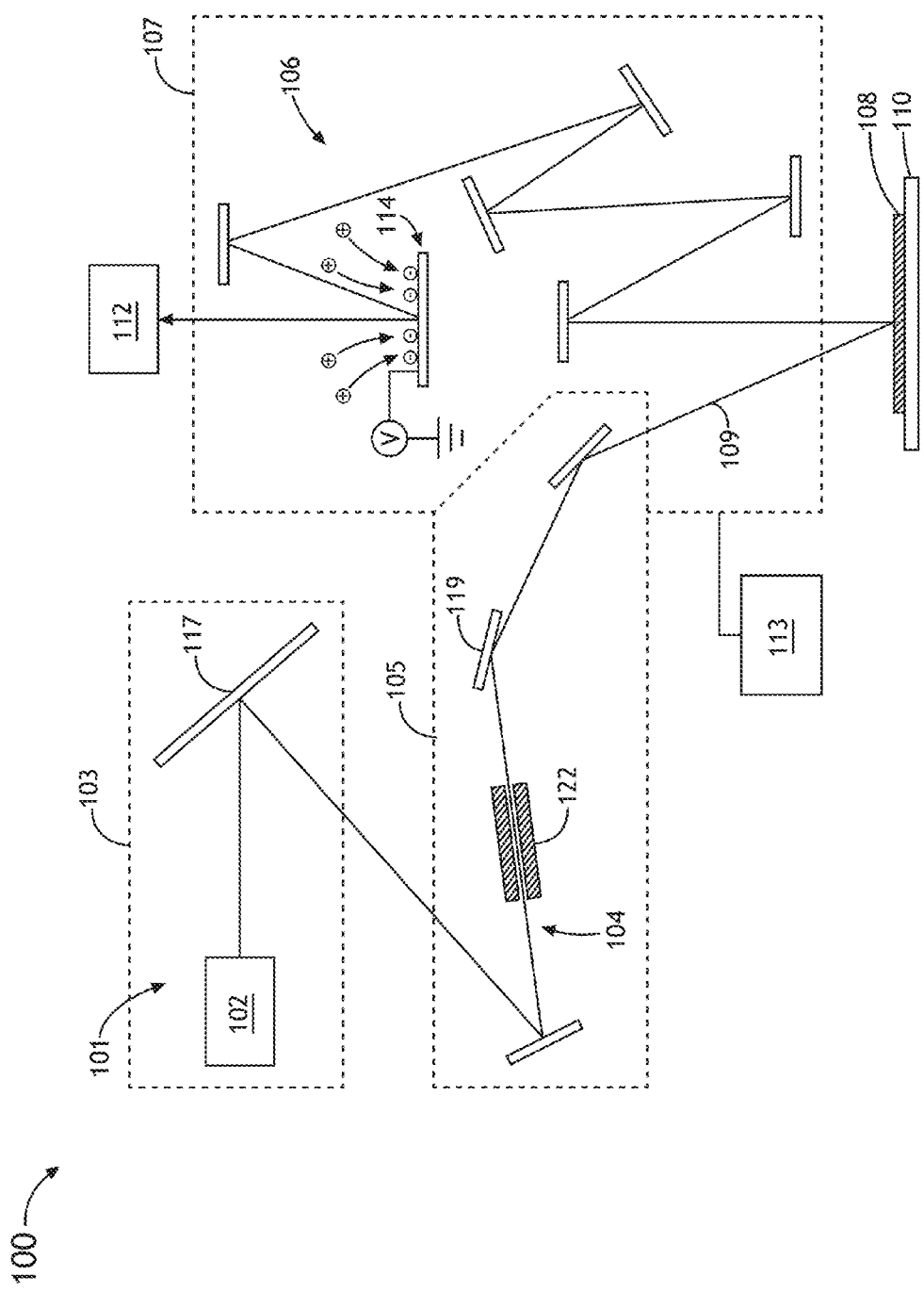
FIG. 1A illustrates a block diagram view of an EUV inspection system, in accordance with one or more embodiments of the present disclosure.

FIG. 1A illustrates a block diagram view of an EUV inspection system 100, in accordance with one or more embodiments of the present disclosure. In one embodiment, the system 100 includes an illumination source 102 configured to generate light. In another embodiment, the system 100 includes a first set of optical elements configured to direct at least a portion of the light to one or more specimens.

In one embodiment, as shown in FIG. 1A, the system 100 includes an illumination sub-system 101. In one embodiment, the illumination sub-system 101 includes an illumination source 102 configured to generate light. For example, the illumination source 102 may include, but is not limited to, a light source suitable for generating EUV light or VUV light. In another embodiment, the illumination sub-system 101 further includes a set of collection optics 117 configured to collect illumination from an illumination source 102. In another embodiment, the system 100 includes a set of illuminator optics 104 configured to direct illumination from the collection optics 117 of the illumination sub-system 101 to one or more specimens 108.

In one embodiment, the illuminator optics 104 may direct illumination 109 emanating from the illumination source 102 to the one or more specimens 108 disposed on a specimen stage 110. For example, the one or more specimens 108 may include, but are not limited to, a wafer (e.g., semiconductor wafer). By way of another example, the one or more specimens 108 may include, but are not limited to, a reticle.

In another embodiment, the system 100 includes a second set of projection elements 106 configured to receive illumination from the surface of the one or more specimens 108 and direct the illumination from the one or more specimens 108 to a detector 112. For example, the system 100 includes a set of projection optics 106 suitable for collecting light scattered, reflected, diffracted or otherwise emanating from the specimen 108 and directing the light to the one or more detectors 112 (e.g., CCD, TDI-CCD, PMT and the like). In another embodiment, the system 100 includes a control system (not shown) for receiving and/or analyzing the measurement results from the detector 112.

In another embodiment, the system 100 includes one or more vacuum chambers (e.g., chambers 103, 105, 107). In this regard, all or a portion of the first set of optical elements and the second set of optical elements may disposed in the one or more vacuum chambers. For example, the illumination sub-system 101, the set of illuminator optics 104, and the set of projection optics 106 may be disposed separate vacuum chambers 103, 105, 107 respectively. By way of another example, all or a portion of the optics associated with illumination sub-system 101, the set of illuminator optics 104, and the set of projection optics 106 may be contained within a common vacuum chamber.

In another embodiment, the one or more vacuum chambers 103, 105, 107 are configured to contain a selected purge gas. The selected purge gas (or at least a constituent of the purge gas) may undergo ionization in the presence of the light emitted by the illumination source 102.

It is noted herein that carbon-containing contamination films or oxidation layers on optical surfaces, such as Ru surfaces, can be removed by introducing a reactive hydrogen (or deuterium) species into the optical system 100. For example, in the case of hydrogen/deuterium, atomic hydrogen (H), $H^+$, $H^{2+}$, and $H^{3+}$ species may be used to react with contaminants, such as carbon or oxygen, present near or on the various optical surface of the optical system 100. For instance, as previously noted, atomic hydrogen or a hydrogen ion may interact with the carbon contamination, generating one or more light hydrocarbons, such as, but not limited to, methane ($CH_4$). The $CH_4$ gas may then be pumped out of the one or more vacuum chambers 103, 105, 107 with one or more associated vacuum pumps, as described further herein. In another instance, in the case of an oxidized ruthenium (Ru) optical surface, an $H^-$ species may react with a $RuO_2$ surface to form the products Ru and $H_2O$. The $H_2O$ gas may then be pumped out of the one or more vacuum chambers 103, 105, 107 with one or more associated vacuum pumps, as described further herein.

As previously noted, reactive gas species may be generated through the exposure of molecular hydrogen (or deuterium or other gases) to EUV and/or VUV radiation. For example, the EUV and/or VUV light emitted by the illumination source 102 may act to ionize molecular hydrogen and/or molecular deuterium (or any other suitable purge gas) contained within the one or more vacuum chambers 103, 105, 107. As such, in the case of hydrogen, the resulting atomic hydrogen and/or hydrogen ions created by the generated light of the system may then be used to clean EUV-induced carbon growth or oxidation.

It is noted herein that any purge gas known in the art suitable for cleaning one or more optical elements of the present disclosure is suitable for implementation in the various embodiments of the present disclosure. In one embodiment, the purge gas includes any gas known in the art that is ionizable by the illumination 109 (e.g., EUV light, VUV light and the like). For example, the purge gas may include, but is not limited to, molecular hydrogen ($H_2$), molecular deuterium ($D_2$) or any simple or complex compound including $H_2$ or $D_2$. In another embodiment, the purge gas may include a mixture of any one or more additional gases, such as helium, with molecular hydrogen ($H_2$), molecular deuterium ($D_2$) or any simple or complex compound including $H_2$ or $D_2$. In another embodiment, the purge gas may include molecular oxygen.

It is noted herein that reactive species in the gas-phase or on the surface of one or more optical elements may be created via direct photon absorption. In addition, secondary electrons emitted from an optical surface may aid in the photodissociation of the contamination or oxidation layer.

For example, the following reactions represent reactions that may take place when molecular hydrogen is exposed to EUV light 108.

$$H_2 + \gamma \rightarrow H_2^+ + e^-$$

$$H_2 + \gamma \rightarrow H^+ + H^0 + e^-$$

$$H_2 + \gamma \rightarrow 2H^+ + 2e^-$$

$$H_2 + \gamma \rightarrow H_2^+ + e^-$$

$$H^+ + H^0 \rightarrow H_2^+ + e^-$$

$$H^{2+} + H_2 \rightarrow H3^+ + H^0$$

Reactions involving reactive species of hydrogen are described in S. V. O'Neil and W. P. Reinhardt, J. Chem. Phys. 69 2126 (1978); and G. Gioumousis and D. P. Stevenson, J. Chem. Phys. 29, 294 (1958), which are both incorporated herein by reference in the entirety.

It is noted herein that VUV radiation may generate atomic ions at a higher rate than EUV radiation in the presence of molecular $H_2$ or other gasses. For example, in the case of $H_2$, H2 has a maximum absorption cross section at a wavelength of approximately 100 nm. The absorption cross-section at 100 nm is approximately four orders of magnitude larger than the absorption cross-section of H2 at 13.5 nm (the wavelength commonly associated with EUV systems). In the case of EUV inspection, lithography and metrology systems, the light sources produce a significant amount of radiation with wavelengths extending to the visible. Multilayer mirrors for inspection, lithography and metrology systems, in addition to having relative high reflectivity at 13.5, also have significant reflectivity for wavelengths between 50-450 nm. The VUV light will thus be readily propagated and can have a significant contribution in producing atomic ions.

Figure 1C:
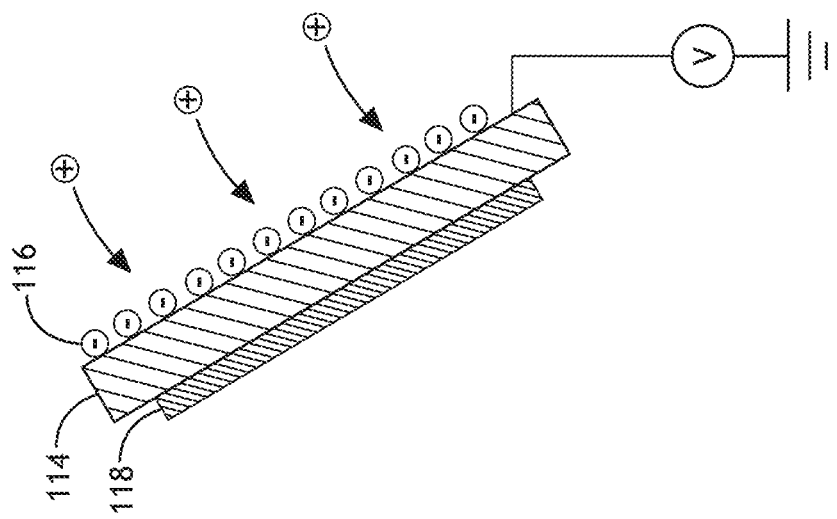
FIG. 1C depicts an electrically biased optical element equipped with a heating element, in accordance with one or more embodiments of the present disclosure.
Figure 1B:
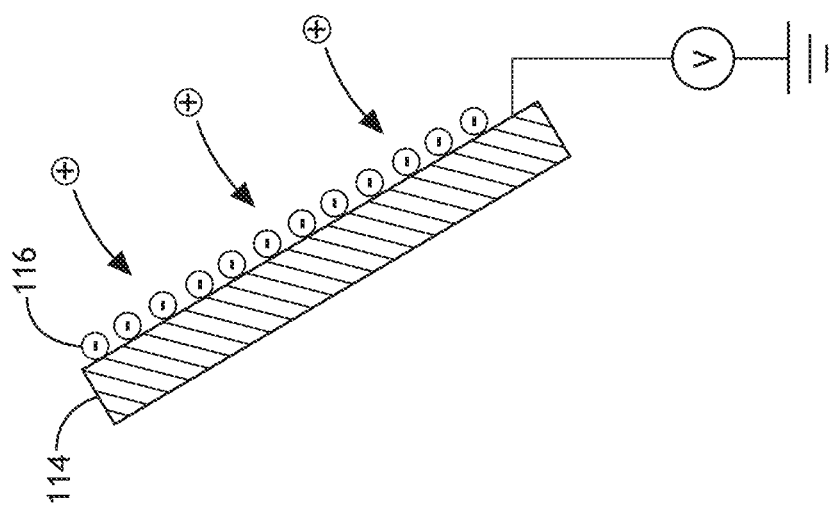
FIG. 1B depicts an electrically biased mirror, in accordance with one or more embodiments of the present disclosure.

In another embodiment, as shown in FIG. 1B, the system 100 includes one or more electrically biased optical elements 114, such as, but not limited to, a mirror. For example, the illumination sub-system 101, the set of illuminator optics 104, the set of projection optics 106 and/or the detector 112 may include an electrically biased optical element 114 having at least one electrically biased surface. In another embodiment, the electrically biased optical element 114 may have a negative bias sufficient to attract one or more ionic species of the selected purge gas, which are created through the photochemical interaction of the illumination 109 from the illumination source 102 and the purge gas contained in the given vacuum chamber 103, 105, 107. In this regard, the ionic gas species attracted to the surface of the biased optical element 114 may serve to enhance the cleaning of contaminants from the electrically biased surface of the biased optical element 114, which is carried out through the various reaction processes described previously herein. In one embodiment, the one or more electrically biased optical elements 114 of the optical system 100 may include any of the one or more mirrors (e.g., 119) or collectors (e.g., 117) of the optical system 100.

In another embodiment, as shown in FIG. 1C, the electrically biased optical element (e.g., mirror 114 or homogenizer tunnel 122) may also include one or more heating elements 118. The one or more heating elements 118 (e.g., resistive heater) may serve to accelerate the cleaning rates of the optical surface of the given optical element through the various reactions described previously herein. It is further noted that the optical system 100 is not limited to the use of the heating element 118 in combination with the electrically biased optical element 114, 122. For example, an optical element of the present disclosure may be equipped with one or more heating elements independent from the electrical biasing characteristics described herein. In this regard, the heating element 118 may be thermally coupled to any optical element of the optical system 100, regardless of whether the respective optical element is or is not electrically biased.

It is noted that the electrical biasing feature of the present disclosure may be applied to any of the optical elements of an EUV inspection, EUV lithography system or any other EUV optical system. For example, any optical elements of the projection optics of an EUV system may be electrically biased, as described herein. EUV projection optics tend to display the highest system sensitivity to changes in reflectivity. Applying a bias voltage to one or more of the projection optics may greatly increase the rate of cleaning of these elements. By way of another example, any optical elements in the illumination sub-system 101/illumination source 102 may be electrically biased, as described herein. For instance, one or more collector elements in the illumination source 102 may be electrically biased, as described herein. By way of another example, an electrical bias may be applied to any elements 117 of the sensor assembly 112 (e.g., TDI sensor assembly).

Figure 1D:
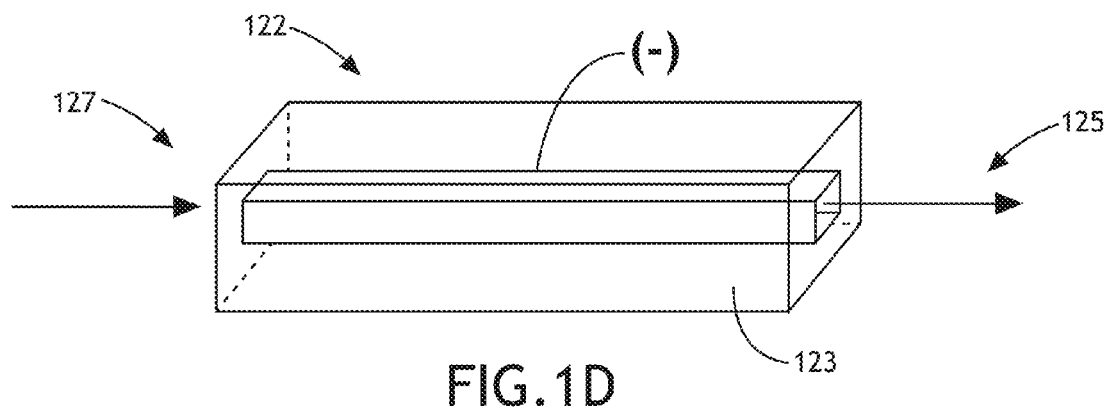
FIG. 1D depicts a homogenizer tunnel with one or more electrically biased internal mirrored surfaces, in accordance with one or more embodiments of the present disclosure.
Figure 1E:
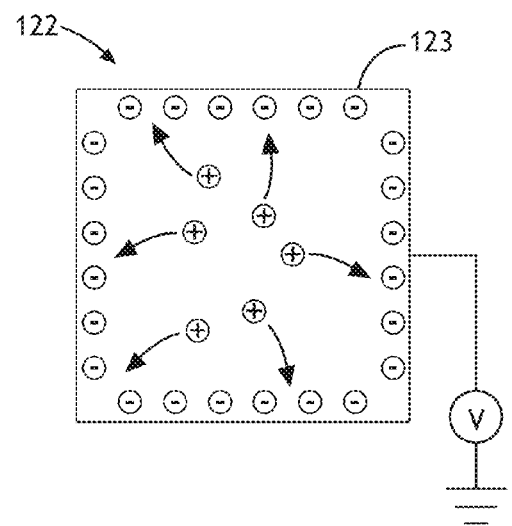
FIG. 1E depicts an end view of a homogenizer tunnel with one or more electrically biased internal mirrored surfaces, in accordance with one or more embodiments of the present disclosure.

In another embodiment, as shown in FIGS. 1D and 1E, the one or more electrically biased optical element of the optical system 100 may include one or homogenizer tunnels 122 of the optical system 100. It is noted herein that the homogenizer tunnel 122 is a reflective tunnel structure having a rectangular cross section. For example, in the case of an EUV optical system, a homogenizer tunnel may consist of a rectangular Ru-coated mirror tunnel having a high aspect ratio, with respect to width and length, as depicted in FIG. 1D. It is recognized herein that such a configuration makes it very difficult to clean the deep internal surfaces of the homogenizer tunnel 122 by merely injecting the respective cleaning species (generated outside of the homogenizer tunnel) through the ends of the homogenizer tunnel 122, as the respective gas species will quickly dissipate upon contact with the internal walls 123 of the homogenizer tunnel 122. In one embodiment, the homogenizer tunnel 122 includes four EUV mirrors 123, such as Ru-coated mirrors, assembled and/or bonded to form a rectangular tunnel. Each of these four planar EUV mirrors 123 may be coated on a single (internal) side. In one embodiment, a purge gas is injected at the optical exit 125 of the tunnel 122 and flows toward the optical entrance 127 of the tunnel to reduce the amount of contamination entering the tunnel from the illumination source 102.

In another embodiment, one or more of the mirrored walls 123 of the homogenizer tunnel 122 may be biased. For example, one or more of the mirrored walls 123 may be negatively biased so as to attract the positive ions generated by exposure of the purge gas to EUV and/or VUV light. In this regard, the ionic gas species attracted to the surface of the mirrored walls 123 of the homogenizer tunnel 122 may serve to clean contaminants from the electrically biased surface of the mirrored walls 123 of the homogenizer tunnel 122 through the various processes described previously herein.

In one embodiment, the voltage applied to the one or more optical elements (e.g., mirror 114 and/or homogenizer tunnel 122) is a DC voltage. In another embodiment, the voltage applied to the one or more optical elements is an AC voltage. It is recognized that the magnitude of the applied bias voltage may include, but is not limited to, a voltage between 0 and 1 kV.

In another embodiment, the system 100 includes one or more vacuum pumps 113 for evacuating one or more gaseous reaction products from the one or more vacuum chambers 103, 105, 107. In one embodiment, the one or more vacuum pumps 113 are suitable for removing the gaseous reaction product(s) formed from the interaction of the ionic species of the purge gas and the one or more contaminant layers of the optical elements of the system 100. For example, methane ($CH_4$) formed from the interaction of hydrogen ions with carbon disposed on a respective optical surface (e.g., biased mirror or collector 114, biased homogenizer tunnel 122, unbiased collector 117 or unbiased mirror 119) may be pumped out of a given vacuum chamber 103, 105, 107, at least in part, by one or more vacuum pumps 113.

By way of another example, gaseous H₂O formed from the interaction of hydrogen ions with an oxide disposed on a respective optical surface may be pumped out of the given vacuum chamber 103, 105, 107, at least in part, by one or more vacuum pumps 113.

In another embodiment, the vacuum chambers 103, 105, 107 include a vacuum system suitable for establishing and maintaining the low-pressure environment of vacuum chamber. For example, the vacuum system may include one or more vacuum pumps 113, such as, but not limited to, a turbo pump and/or a roots pump backed with a dry pumping unit and equipped with an exhaust system (not shown).

In one embodiment, the optical system 100 is configured as a wafer inspection system or a reticle inspection system. In this regard, the optical system 100 may include any wafer or reticle inspection optical architecture known in the art suitable for operating in the EUV and/or VUV spectral range. It is further recognized that the optical system 100 may be configured as EUV mask blank inspection system. EUV-based mask blank inspection is described generally in U.S. Pat. No. 8,711,346 to Stokowski, issued on Apr. 29, 2014, which is incorporated herein by reference in the entirety. EUV-based mask blank inspection is described generally in U.S. patent application Ser. No. 13/417,982 to Xiong et al., filed on Mar. 12, 2012, which is incorporated herein by reference in the entirety. EUV-based reticle inspection is generally described in U.S. patent application Ser. No. 13/905,449 to Nasser-Ghodsi et al., filed on May 30, 2013, which is incorporated herein by reference in the entirety.

In another embodiment, although not shown, the optical system 100 may be configured as an EUV lithography system. In one embodiment, the optical lithography system (not shown) may include a set of illuminator optics configured to direct output light from the light source 100 to an EUV-compatible lithography mask (e.g., EUV reflective mask). In another embodiment, the lithography system includes a set of projection optics configured to receive illumination reflected from the mask and direct the reflected illumination from the mask to one or more wafers disposed on a wafer stage. The optical lithography system may include any EUV lithography system known in the art. EUV-based lithography is described generally in U.S. patent application Ser. No. 13/419,042 to Wang, filed on Mar. 13, 2012, which is incorporated herein by reference in the entirety.

FIGS. 2A-2D illustrate a block diagram view of an EUV inspection system 100 equipped with an ionizing homogenizer tunnel 201, in accordance with one or more embodiments of the present disclosure. In one embodiment, the EUV inspection system 100 includes an ionizing homogenizer tunnel 201 arranged to homogenize light emitted by the illumination source 102. In another embodiment, the ionizing homogenizer tunnel 201 serves to ionize a fill gas contained within the homogenizer tunnel 201. In this regard, the homogenizer tunnel 201 may enhance and/or accelerate the production of reactive gas species inside the volume of the homogenizer tunnel 201. As noted previously herein, these reactive gas species may then serve to clean contaminant and oxide materials from the internal mirror surfaces 203. It is noted herein that the ionizing homogenizer tunnel 201 may ionize the fill gas through a variety of mechanisms, including application of voltage across the fill gas volume with electrodes, the use of a field emitter, the use of RF dissociation and the use of electron/photon ionization of a neutral gas species.

It is noted herein that the pressure of the fill gas may impact the ion potential for current flow. It is further noted that the fill gas can be ionized more readily when it is held at a low pressure and that the required ionization potential is dependent upon the type of fill gas used in the ionizing homogenizer tunnel 201.

Figure 2A:
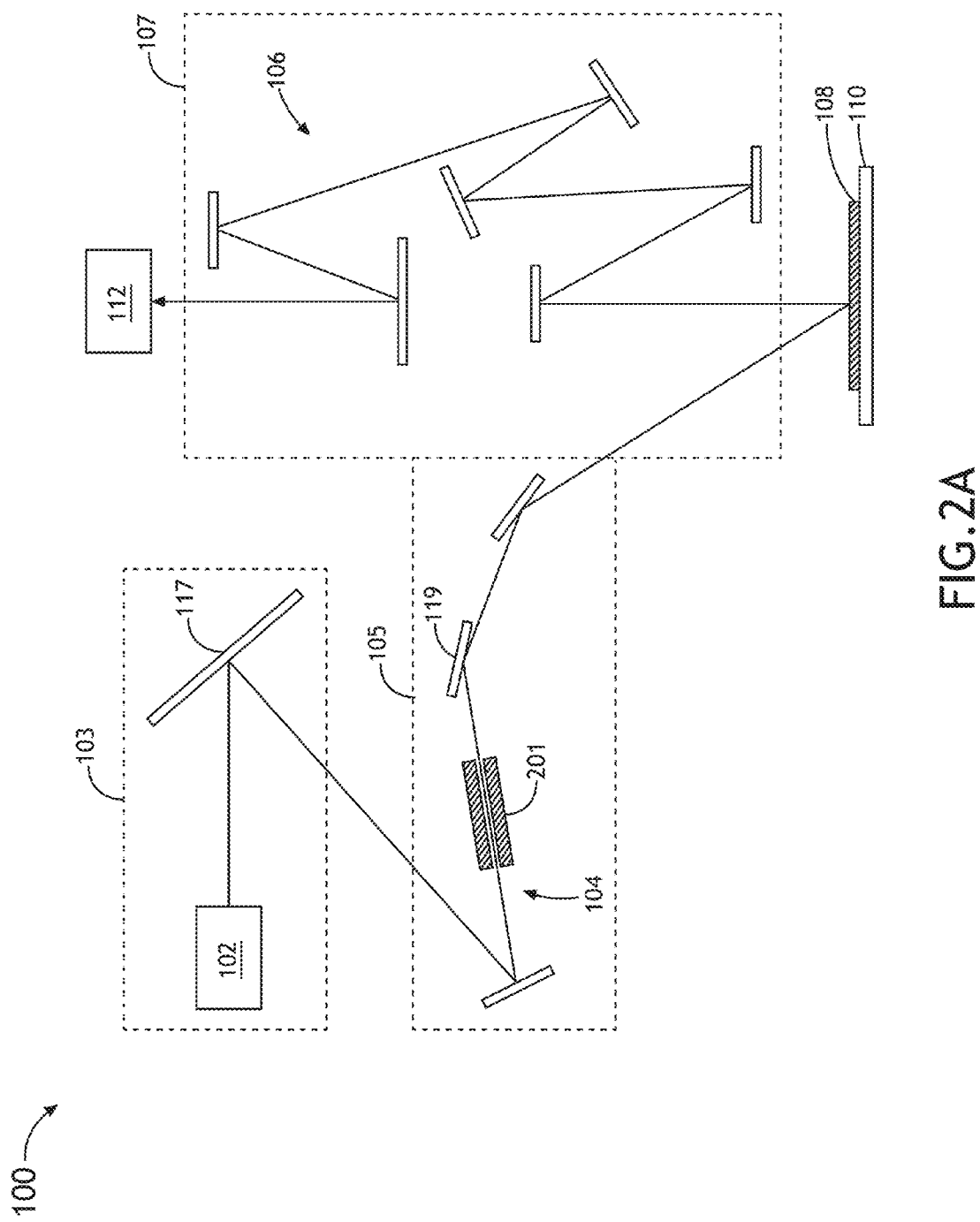
FIG. 2A illustrates a block diagram view of an EUV inspection system equipped with an ionizing homogenizer tunnel, in accordance with one or more embodiments of the present disclosure.
Figure 2B:
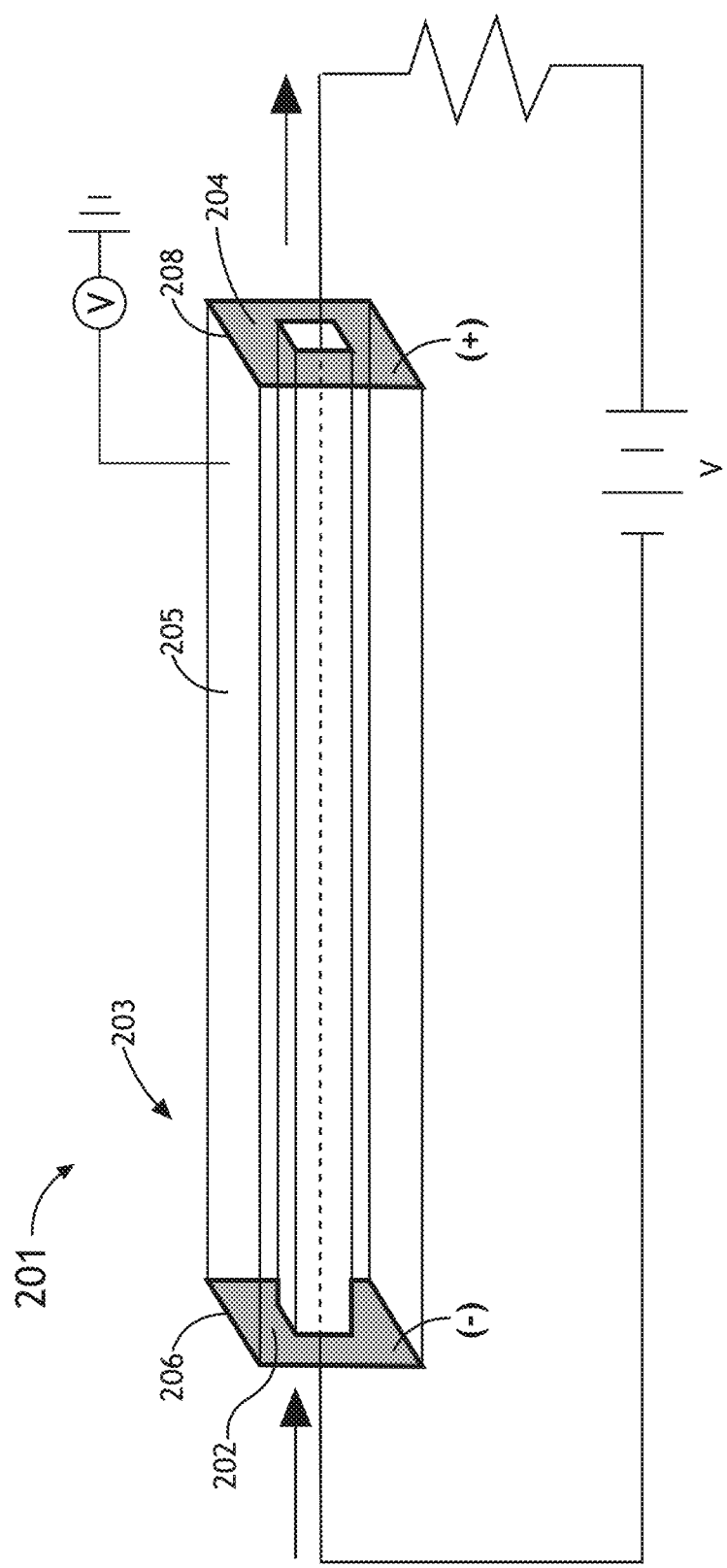
FIG. 2B depicts an ionizing homogenizer tunnel suitable for applying a voltage along the length of the homogenizer tunnel, in accordance with one or more embodiments of the present disclosure.

FIG. 2B depicts an ionizing homogenizer tunnel 201 suitable for applying a voltage along the length of the homogenizer tunnel 201, in accordance with one or more embodiments of the present disclosure. In one embodiment, the homogenizer tunnel 201 includes a homogenizer tunnel assembly 203 formed from four electrodes 205 with internally mirrored surfaces. It is noted herein that the construction of the homogenizer tunnel 201 is similar to the construction of the homogenizer tunnel 122 described previously herein and the description associated with homogenizer tunnel 122 should be interpreted to extend to homogenizer tunnel 201. In another embodiment, the homogenizer tunnel assembly 203 is configured to contain a selected fill gas. For example, the fill gas may include any of the purge gases used in system 100, which are gases that may be ionized to form reactive cleaning gases. For instance, the fill gas may include, but is not limited to, molecular hydrogen, molecular deuterium or a mixture of two or more gases. In another embodiment, the homogenizer tunnel 201 is equipped with electrically isolated end electrodes 202, 204 suitable for applying a voltage across the length of the internal volume of the homogenizer tunnel assembly 203. In one embodiment, a first end electrode 202 disposed at a first end of the homogenizer tunnel assembly 203. In another embodiment, a second end electrode 204 is disposed at a second end of the homogenizer tunnel assembly 203. In one embodiment, a voltage may be applied between the first end electrode 202 and the second end electrode 204. In this regard, the voltage applied may be sufficient to ionize the fill gas (or at least a constituent of the fill gas) contained within the rectangular homogenizer tunnel assembly 203.

In one embodiment, a DC voltage may be applied to the electrodes 202, 204. In another embodiment, an AC voltage may be applied to the electrodes 202, 204. In this regard, the homogenizer tunnel 201 may serve as a RF cavity, whereby the applied signal serves to ionize one or more components of the fill gas through RF dissociation.

In another embodiment, one or more of the four internal wall electrodes 205 are biased. In one embodiment, the one or more of the four internal wall electrodes 205 may be negatively biased so as to attract positive ions generated in the fill gas through the application of voltage with electrodes 202, 204. It is noted herein that the application of bias to the wall electrodes 205 and the processes and interactions at the surface of the mirrored wall electrodes 205 are similar to those described previously herein with respect to homogenizer tunnel 122 and mirror 114.

In another embodiment, the homogenizer tunnel assembly 203 includes one or more insulating structures to insulate the end electrodes 202, 204 from one or more of the four internal mirrored wall electrodes 205. In one embodiment, the homogenizer tunnel assembly 203 includes a first insulating structure 206. For example, the first insulating structure 206 may surround at least a portion of an edge portion of the first end electrode 202 so to electrically insulate the first end electrode from one or more internal wall electrodes 205 of the homogenizer tunnel assembly 203. In another embodiment, the homogenizer tunnel assembly 203 includes a second insulating structure 208. For example, the second insulating structure 208 may surround at least a portion of an edge portion of the second end electrode 204 so to electrically insulate the second end electrode 204 from one or more internal wall electrodes 205 of the homogenizer tunnel assembly 203. It is noted that the electrical configuration of the present embodiment is not limited to that shown in FIG. 2B. Rather, the configuration provided in FIG. 2B is provided merely for illustrative purposes.

Figure 2C:
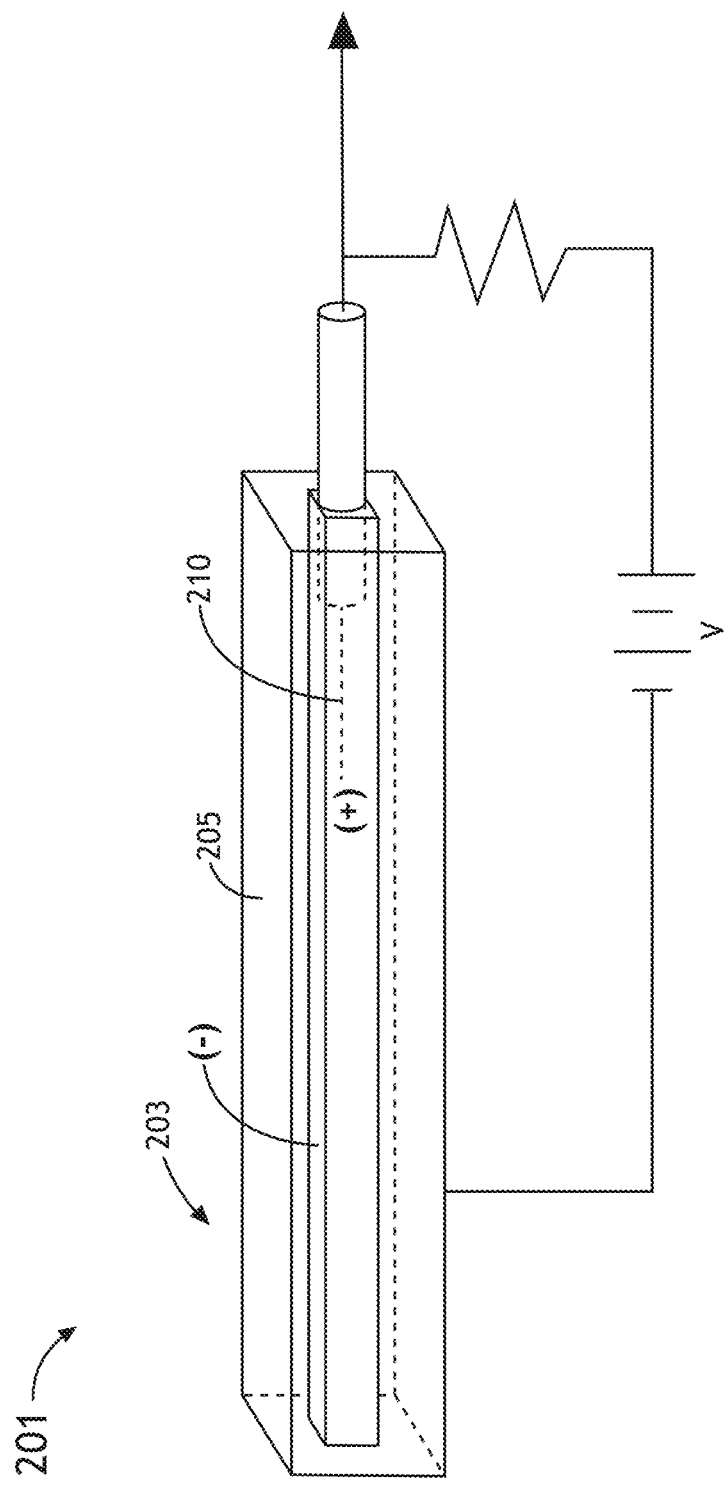
FIG. 2C depicts an ionizing homogenizer tunnel suitable for ionizing the fill gas within the homogenizer tunnel via field emission, in accordance with one or more embodiments of the present disclosure.

FIG. 2C depicts an ionizing homogenizer tunnel 201 suitable for ionizing the fill gas within the homogenizer tunnel 201 via field emission, in accordance with one or more embodiments of the present disclosure. It is noted herein that field ionization techniques are based on electron tunneling from an emitter, which is biased at a high electrical potential. When a high potential is applied to a respective emitter, a high electric field is established near the tip of the emitter (e.g., one or more filaments). As the gas molecules pass near the emitter, they are ionized via an electron tunneling process.

In one embodiment, the ionizing homogenizer tunnel 201 includes one or more field emitters 210. In one embodiment, a large positive bias is applied to the one or more field emitters 210 causing field emission at the emitter tip. As noted, when a gas molecule of the fill gas comes in adequate proximity of the field emitter 210 the gas molecule (e.g., $H_2$) is ionized via an electron tunneling process. In another embodiment, as in the case of FIG. 2B, the one or more wall electrodes 205 of the homogenizer tunnel assembly 203 may be negatively biased. In this regard, after gas molecules are ionized by the field emitter 210 the negatively biased one or more internal wall electrodes 205 may attract the ions to the surface of the internal wall electrodes 205, thereby cleaning or suppressing contamination and/or oxidation.

In another embodiment, the field emitter 210 may be constructed from any field emitter device known in the art. For example, the field emitter 210 may include one or more filament structures. For instance, the field emitter 210 may include, but is not limited to, a tungsten filament, a nanotube filament structure (e.g., carbon nanotube filaments), and the like. In another embodiment, the field emitter 210 may include a field emitter array. It is noted herein that the components and processes described previously herein with respect to the homogenizer tunnel 122 and the homogenizer tunnel 201 depicted in FIG. 2B should be interpreted to extend to the present embodiment.

Figure 2D:
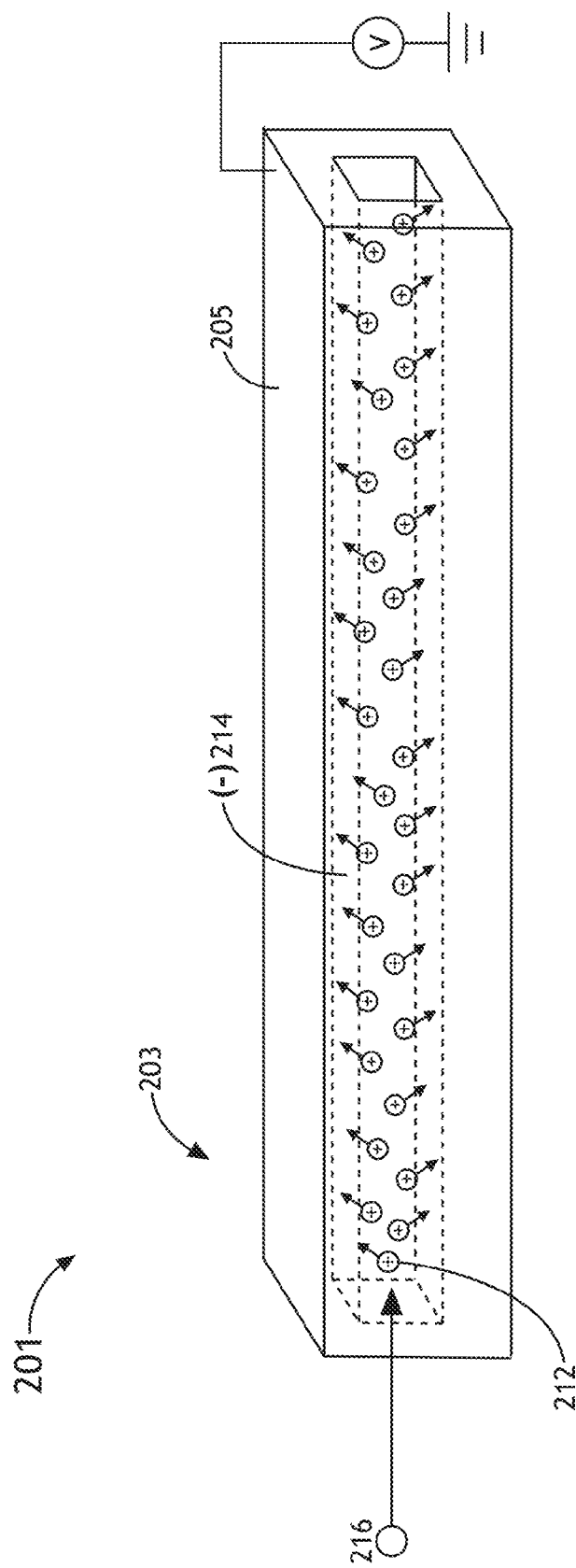
FIG. 2D depicts an ionizing homogenizer tunnel suitable for ionizing the fill gas within the homogenizer tunnel via high energy particle impact, in accordance with one or more embodiments of the present disclosure.

FIG. 2D depicts an ionizing homogenizer tunnel 201 suitable for ionizing the fill gas within the homogenizer tunnel 201 via high energy particle impact, in accordance with one or more embodiments of the present disclosure. It is noted herein that ionization of the fill gas may include ionization via high energy particle (e.g., electrons, x-rays, and the like) interaction with one or more fill gas molecules. For example, in the case of ionization via electron impact, a beam of electrons 216 (e.g., generated via electron source) may be directed through the fill gas contained within the homogenizer tunnel assembly 203. In this regard, an electron 216 that collides with a neutral gas molecule can "knock off" one or more electrons, resulting in a positively charged ion. In another embodiment, as in the case of FIGS. 2B and 2C, the one or more internal wall electrodes 205 of the homogenizer tunnel assembly 203 may be negatively biased. In this regard, after gas molecules are ionized by the given electron 216 the negatively biased one or more internal wall electrodes 205 may attracted the ions, thereby cleaning or suppressing contamination and/or oxidation. It is noted herein that the components and processes described previously herein with respect to the homogenizer tunnel 122 and the homogenizer tunnel 201 depicted in FIGS. 2B and 2C should be interpreted to extend to the present embodiment.

Figure 3A:
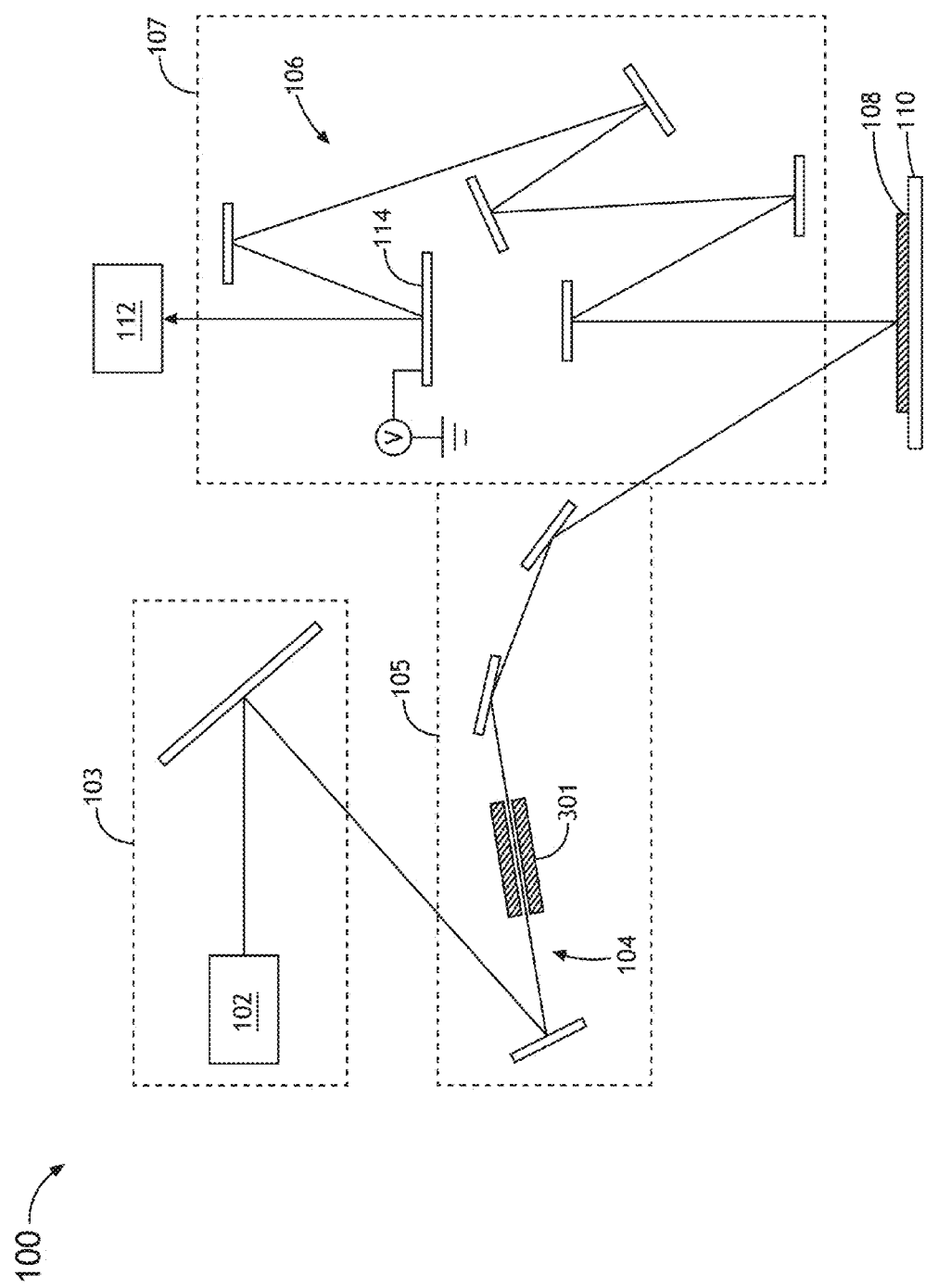
FIG. 3A illustrates a block diagram view of an EUV inspection system equipped with a pressurized homogenizer tunnel, in accordance with one or more embodiments of the present disclosure.
Figure 3B:
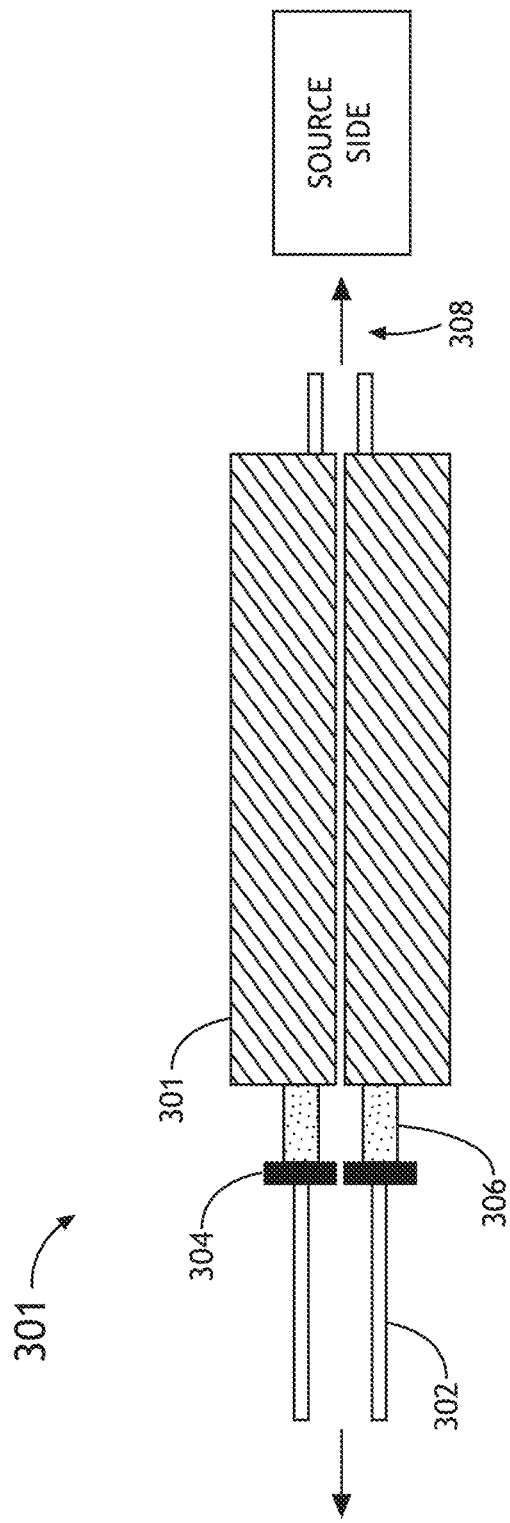
FIG. 3B depicts a pressurized homogenizer tunnel suitable for maintaining a high fill gas pressure and/or establishing a pressure wave within the homogenizer tunnel, in accordance with one or more embodiments of the present disclosure.
Figure 3C:
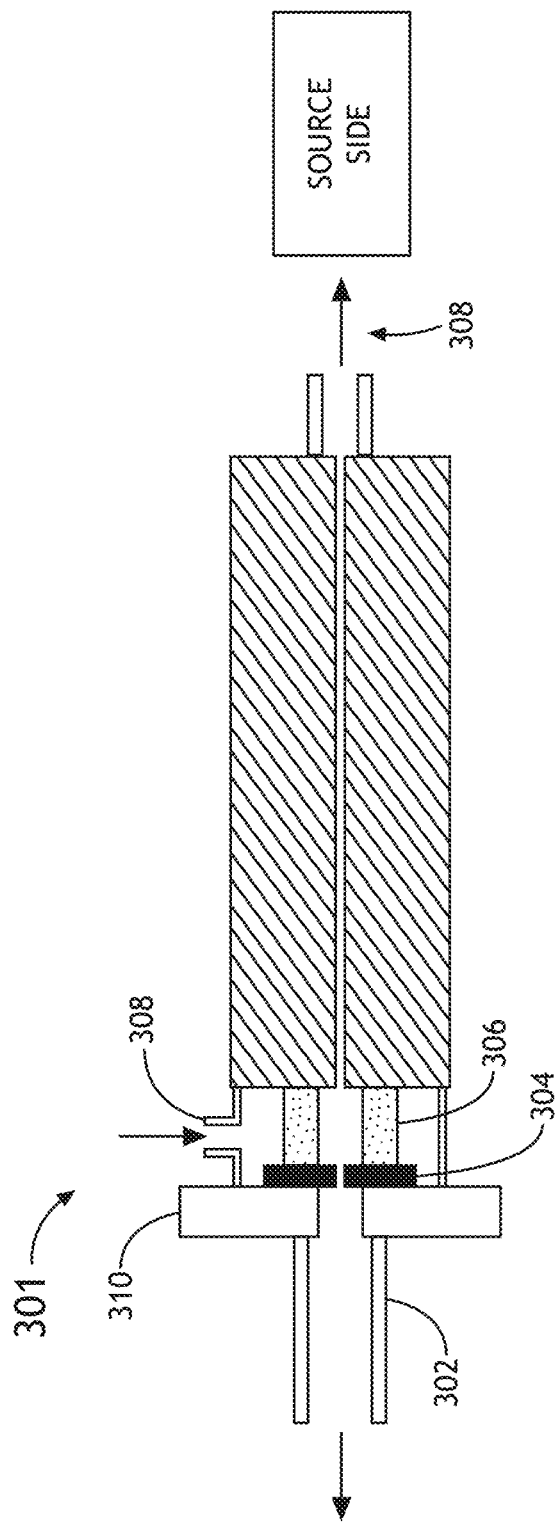
FIG. 3C depicts a pressurized homogenizer tunnel suitable for maintaining a high fill gas pressure and/or establishing a pressure wave within the homogenizer tunnel, in accordance with one or more embodiments of the present disclosure.

FIGS. 3A-3C illustrate a block diagram view of an EUV inspection system 100 equipped with a pressurized homogenizer tunnel 301, in accordance with one or more embodiments of the present disclosure.

In one embodiment, the EUV inspection system 100 includes a pressurized homogenizer tunnel 301 arranged to homogenize light emitted by the illumination source 102. In this regard, the pressurized homogenizer tunnel 301 may enhance the cleaning of the internal surfaces of the homogenizer tunnel 301 via the application of high pressure (e.g., 10-200 Pa) and/or the application of a pressure wave down the length of the homogenizer tunnel 301.

In one embodiment, the homogenizer tunnel 301 includes a homogenizer tunnel assembly 303. For example, the homogenizer tunnel assembly 303 may be electrically inactive or may be formed from four electrodes with internally mirrored surfaces so as to work in conjunction with the electrical biasing embodiments described previously herein. In another embodiment, the homogenizer tunnel assembly 303 is configured to contain a selected fill gas. For example, the fill gas may include any of the purge/fill gases described previously herein. For instance, the fill gas may include, but is not limited to, molecular hydrogen, molecular deuterium, helium or a mixture of two or more gases.

FIG. 3B depicts a pressurized homogenizer tunnel 301 suitable for maintaining a high fill gas pressure and/or establishing a pressure wave within the homogenizer tunnel 301, in accordance with one or more embodiments of the present disclosure. In one embodiment, the homogenizer tunnel 301 includes a fill gas supply unit 305. In one embodiment, the fill gas supply unit 305 of FIG. 3B is configured to supply a fill gas flow through the homogenizer tunnel assembly 303 such that a high fill gas pressure (e.g., 10-200 Pa) is established within the homogenizer tunnel assembly 303. For example, in the event of unacceptable contamination or oxidation growth inside the homogenizer tunnel 301, the homogenizer tunnel 301 may be cleaned by establishing a relatively high $H_2$ pressure inside the homogenizer tunnel 301.

In one embodiment, as shown in FIG. 3B, the fill gas supply unit 305 includes, but is not limited to, a barrier tube 302, a flow orifice 304 and input 306 (e.g., sintered input). It is noted herein that the barrier tube 302 may serve to extend the fill gas flow beyond the boundary of the homogenizer tunnel assembly 303 in an effort to minimize contaminants reaching the inside of the homogenizer tunnel assembly 303. Further, the flow orifice 304 and input 306 serve to establish a gas pressure boundary between the output of the homogenizer tunnel assembly 303 and the external region.

FIG. 3C depicts a pressurized homogenizer tunnel 301 suitable for maintaining a high fill gas pressure and/or establishing a pressure wave within the homogenizer tunnel 301, in accordance with one or more embodiments of the present disclosure.

In one embodiment, the fill gas supply unit 305 of FIG. 3C is configured to supply a fill gas flow through the homogenizer tunnel assembly 303 such that a fill gas pressure wave is propagated along the internal volume of the homogenizer tunnel assembly 303. For example, the fill gas supply unit 305 may supply a "burst" of high pressure gas, which establishes a pressure wave within the homogenizer tunnel assembly 303. As the pressure wave propagates down the homogenizer tunnel 301, the gas species act to clean contamination or oxidation from the internal surface of the homogenizer tunnel assembly 303.

This approach allows for the preferential creation of the cleaning species within different portions of the length of the homogenizer tunnel assembly 303 by manipulating pressure along the homogenizer tunnel assembly 303. By creating a pressure drop along the tunnel and manipulating the placement of the preferred cleaning pressure point along the tunnel length, the fill gas supply unit 305 may "walk" the cleaning wave front from one end of the homogenizer tunnel assembly 303 to the other. It is noted herein that such a feature is difficult to accomplish by physically injecting the cleaning species down the length of the tunnel because any injection ports on the tunnel assembly wall itself may create optical occlusions that will project on the imaging plane of the device.

As shown in FIG. 3C, the fill gas supply unit 305 includes gas input 308 and barrier 310 configured to allow for a burst of high pressure fill gas to be supplied into the homogenizer tunnel assembly 303. It is noted that this input 308 is not along the homogenizer tunnel wall itself, but is displaced from the tunnel in order to avoid optical occlusions, as described above. While not shown, the gas input 308 of the fill gas supply unit 305 may be fluidically coupled to a fill gas source, with the supply of gas from the source being controlled by any fluid control system no in the art suitably for delivering gas bursts. For example, the gas input 308 may, but is not required to, supply a high pressure burst of $H_2$ at a pressure between approximately 100 and 200 Pa. It is again noted that the embodiments in FIGS. 3B and 3C are not limited to the use of $H_2$. It is noted herein that the embodiments depicted in FIGS. 3A-3C are not limited to the application of high pressure $H_2$. It is recognized herein that a variety of other high pressure gases may be suitable for cleaning the homogenizer tunnel 301 via high pressure and/or the application of a pressure wave, such as, but not limited to, deuterium, helium, and the like.

It is contemplated herein that the various embodiment of the present invention may be implement conjunctively or independently. For example, the embodiments depicted in FIGS. 1A-E, FIGS. 2A-2D and FIGS. 3A-3C should be interpreted to be applicable in conjunction with one another.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. An optical system comprising:
   an illumination source configured to generate light;
   a detector;
   a first set of optical elements configured to direct at least a portion of the light to one or more specimens;
   a second set of optical elements configured to receive illumination from the surface of the one or more specimens and direct the illumination from the one or more specimens to the detector; and
   one or more vacuum chambers, wherein at least one of the first set of optical elements or the second set of optical elements are disposed in the one or more vacuum chambers, wherein the one or more vacuum chambers are configured to contain a selected purge gas ionizable by the light emitted by the illumination source,
   wherein at least one of the first set of optical elements or the second set of optical elements comprises an electrically biased optical element including a negatively charged reflective surface to attract one or more positively charged ionic species of the selected purge gas to the negatively charged reflective surface in order to clean contaminants from the negatively charged reflective surface.

2. The optical system of claim 1, wherein the optical system is configured as a wafer inspection system.

3. The optical system of claim 1, wherein the optical system is configured as a mask inspection system.

4. The optical system of claim 1, wherein the illumination source comprises:
   an illumination source configured to generate at least one of extreme ultraviolet light or vacuum ultraviolet light.

5. The optical system of claim 1, wherein the selected purge gas comprises:
   at least one molecular hydrogen or molecular deuterium.

6. The optical system of claim 1, wherein the selected purge gas comprises:
   a mixture of two or more gases.

7. The optical system of claim 6, wherein the illumination source is configured to generate light suitable for causing a reaction within at least one constituent of the purge gas to generate at least one of one or more hydrogen ions or one or more deuterium ions.

8. The optical system of claim 7, wherein at least some of the one or more hydrogen ions or the one or more deuterium ions react with a contaminant material disposed on the negatively charged reflective surface of the electrically biased optical element.

9. The optical system of claim 8, wherein contaminant material disposed on the negatively charged reflective surface of the electrically biased optical element includes at least one of a material including carbon or a material including oxygen.

10. The optical system of claim 7, wherein at least some of the one or more hydrogen ions or the one or more deuterium ions react with a contaminant material disposed on the negatively charged reflective surface of the electrically biased optical element to form a gaseous reaction product.

11. The optical system of claim 10, further comprising:
a vacuum pump configured to evacuate the gaseous reaction product from the vacuum chamber.

12. The optical system of claim 1, wherein the electrically biased optical element is biased with at least one of an AC voltage or a DC voltage.

13. The optical system of claim 1, further comprising:
a heating element thermally coupled to a selected portion of at least one of an optical element of the first set of optical elements or an optical element of the second set of optical elements.

14. The optical system of claim 13, wherein the heating element is thermally coupled to the electrically biased optical element.

15. The optical system of claim 1, wherein the electrically biased optical element comprises:
a homogenizer tunnel, wherein one or more internal surfaces of the homogenizer tunnel are negatively charged.

16. The optical system of claim 1, wherein the electrically biased optical element comprises:
a mirror, wherein one or more surfaces of the mirror are negatively charged.

17. An optical system comprising:
an illumination sub-system, the illumination sub-system including an illumination source configured to generate at least extreme ultraviolet light, the illumination sub-system further including a set of collection optics configured to collect illumination from an illumination source;
a set of illuminator optics configured to direct illumination from the collection optics of the illumination sub-system to one or more specimens;
a detector;
a set of projection optics configured to receive illumination from the surface of the one or more specimens and direct the illumination from the one or more specimens to the detector; and
one or more vacuum chambers, wherein at least one of the illumination sub-system, the set of illuminator optics, the detector or the set of projection optics are disposed in the one or more vacuum chambers, wherein the one or more vacuum chambers are configured to contain a selected purge gas ionizable by the extreme ultraviolet light emitted by the illumination source,
wherein at least one of the one or more mirrors of the set of collection optics of the illumination sub-system, the one or more mirrors of the set of illuminator optics or the one or more mirrors of the set of projection optics comprises an electrically biased optical element including a negatively charged reflective surface to attract one or more positively charged ionic species of the selected purge gas to the negatively charged reflective surface in order to clean contaminants from the negatively charged reflective surface.

18. The optical system of claim 17, wherein the optical system is configured as a wafer inspection system.

19. The optical system of claim 17, wherein the optical system is configured as a mask inspection system.

20. The optical system of claim 17, wherein the fill gas comprises:
at least one of molecular hydrogen or molecular deuterium.

21. The optical system of claim 17, wherein the fill gas comprises:
a mixture of two or more gases.

* * * * *